(12) United States Patent
Lee et al.

(10) Patent No.: US 10,685,207 B2
(45) Date of Patent: Jun. 16, 2020

(54) FINGERPRINT SENSING STRUCTURE WITH SMALL CURVATURE RADIUS

(71) Applicant: SUPERC-TOUCH CORPORATION, New Taipei (TW)

(72) Inventors: Hsiang-Yu Lee, New Taipei (TW); Shang Chin, New Taipei (TW); Ping-Tsun Lin, New Taipei (TW); Chia-Hsun Tu, New Taipei (TW)

(73) Assignee: SUPERC-TOUCH CORPORATION, New Taipei (TW)

( * ) Notice: Subject to any disclaimer, the term of this patent is extended or adjusted under 35 U.S.C. 154(b) by 176 days.

(21) Appl. No.: 16/116,876

(22) Filed: Aug. 29, 2018

(65) Prior Publication Data

US 2019/0095683 A1 Mar. 28, 2019

(30) Foreign Application Priority Data

Sep. 26, 2017 (TW) .............................. 106133022 A

(51) Int. Cl.
| | |
|---|---|
| *G06K 9/20* | (2006.01) |
| *G06K 9/00* | (2006.01) |
| *H01L 51/00* | (2006.01) |
| *H01L 27/12* | (2006.01) |
| *H01L 23/498* | (2006.01) |

(52) U.S. Cl.
CPC ....... *G06K 9/00053* (2013.01); *G06K 9/0002* (2013.01); *H01L 23/49872* (2013.01); *H01L 27/124* (2013.01); *H01L 51/0097* (2013.01)

(58) Field of Classification Search
CPC .... G06K 9/0002; G06K 9/00006–0012; H01L 51/0097; H01L 23/4985; H01L 23/5387; H01L 31/03926; H01L 41/0475; H01L 2251/5338; H05K 1/0393
See application file for complete search history.

(56) References Cited

U.S. PATENT DOCUMENTS

| | | | |
|---|---|---|---|
| 10,282,587 B2 * | 5/2019 | Choi .................. | G06K 9/00013 |
| 2015/0296622 A1 * | 10/2015 | Jiang ..................... | G01L 1/2268 361/750 |
| 2016/0104024 A1 * | 4/2016 | Slogedal .............. | G06K 9/0002 324/649 |
| 2018/0204037 A1 * | 7/2018 | Hargreaves .......... | G06K 9/0002 |
| 2019/0067408 A1 * | 2/2019 | Sun ..................... | H01L 51/0097 |

* cited by examiner

*Primary Examiner* — Brian Werner
(74) *Attorney, Agent, or Firm* — Chun-Ming Shih; HDLS IPR Services

(57) ABSTRACT

A fingerprint sensing structure includes a flexible substrate divided into a fingerprint-sensing region and a non-fingerprint-sensing region. In the non-fingerprint-sensing region, the fingerprint sensing structure includes a plurality of organic insulating layers, a wiring layer having conductive wires and at least one inorganic insulating layer, where the wiring layer is sandwiched between two organic insulating layers to render the portion of the fingerprint sensing structure corresponding to non-fingerprint-sensing region to have bending with curvature radius not larger than 2 mm. In the finger sensing region, the fingerprint sensing structure includes a thin film transistor layer and a sensing electrode layer. The thin film transistor layer includes a plurality of thin film transistors, a plurality of conductive wires respectively along a first direction and a second direction. The sensing electrode layer has a plurality of sensing electrodes to sense surface features of living organism.

13 Claims, 7 Drawing Sheets

FINGERPRINT SENSING STRUCTURE WITH SMALL CURVATURE RADIUS

BACKGROUND OF THE INVENTION

Field of the Invention

The present invention relates to a fingerprint sensing structure, especially to fingerprint sensing structure with small curvature radius.

Description of Prior Art

Biometric recognition technologies have rapid development due to the strong request from electronic security applications and automatic access control system. The biometric recognition technologies can be classified into fingerprint recognition, iris recognition and DNA recognition and so on. For the considerations of efficiency, safety and non-invasiveness, the fingerprint recognition becomes main stream technology. The fingerprint recognition device can scan fingerprint image by optical scanning, thermal imaging or capacitive imaging. For cost, power-saving, reliability and security concerns, the capacitive fingerprint sensor becomes popular for biometric recognition technology applied to portable electronic devices.

The conventional fingerprint sensor generally integrates the sensing electrodes and the sensing circuit into one integrated circuit (IC), namely, the fingerprint identification IC. A hole is defined on the protection glass of the display to embed the fingerprint identification IC chip therein. However, the waterproof ability is influenced and the material and packaging cost also increases. The product yield, lifetime and durability are also degraded. It is desirable to overcome above-mentioned problems.

It is an object of the present invention to provide protection to the conductive wires of the fingerprint sensor such that a portion of the non-fingerprint-sensing region can be bent with small curvature radius, thus prevent the breakage of the conductive wires and enhance product yield, lifetime and durability.

SUMMARY OF THE INVENTION

Accordingly, the present invention provides a fingerprint sensing structure with small curvature radius, comprising:

a flexible substrate divided into a fingerprint-sensing region and a non-fingerprint-sensing region;

in the non-fingerprint-sensing region, the fingerprint sensing structure comprising:

a plurality of organic insulating layers, a wiring layer having a plurality of conductive wires, where the wiring layer is sandwiched between two organic insulating layers to render a portion of the fingerprint sensing structure corresponding to the non-fingerprint-sensing region to have bending with curvature radius not larger than 2 mm;

at least one inorganic insulating layer, wherein the wiring layer is arranged between one of the organic insulating layers and the at least one inorganic insulating layer;

in the finger-sensing region, the fingerprint sensing structure comprising:

a thin film transistor layer comprising:

a plurality of thin film transistors, a plurality of conductive wires along a first direction, a plurality of conductive wires along a second direction, a sensing electrode layer having a plurality of sensing electrodes to sense surface features of living organism According to one embodiment of the present invention, the fingerprint sensing structure with small curvature radius further comprises a first shielding layer arranged in the non-fingerprint-sensing region of the fingerprint sensing structure and having at least one shielding electrode.

According to one embodiment of the present invention, the first shielding layer is sandwiched between two organic insulating layers.

According to one embodiment of the present invention, the fingerprint sensing structure with small curvature radius further comprises a second shielding layer arranged in the non-fingerprint-sensing region of the fingerprint sensing structure and having at least one shielding electrode.

According to one embodiment of the present invention, the second shielding layer is sandwiched between two organic insulating layers.

According to one embodiment of the present invention, the fingerprint sensing structure with small curvature radius further comprises a plurality of conductive pads arranged in the non-fingerprint-sensing region of the fingerprint sensing structure, the plurality of conductive pads electrically connecting with the conductive wires respectively.

According to one embodiment of the present invention, the fingerprint sensing structure with small curvature radius further comprises a fingerprint identification integrated circuit (IC) in the non-fingerprint-sensing region of the fingerprint sensing structure, the fingerprint identification IC having a plurality of contacts electrically connecting with the conductive pads respectively.

According to one embodiment of the present invention, the conductive wires in the non-fingerprint-sensing region are made from transparent conductive material or metallic material.

According to one embodiment of the present invention, the conductive wires along the first direction in the fingerprint-sensing region and the conductive wires along the second direction in the fingerprint-sensing region are made from transparent conductive material or metallic material.

According to one embodiment of the present invention, the fingerprint sensing structure with small curvature radius further comprises a protection layer in the fingerprint-sensing region to prevent damage caused by finger scratch or pressing.

According to one embodiment of the present invention, the fingerprint sensing structure with small curvature radius further comprises a printing decorative layer in the fingerprint-sensing region.

According to one embodiment of the present invention, a thickness of the fingerprint sensing structure in the fingerprint-sensing region and not including the protection layer is smaller than 300 um or 250 um.

By sandwiching the wiring layer between two organic insulating layers, a portion of the fingerprint sensing structure having bending with smaller curvature radius, thus prevent the breakage of the conductive wires and enhance product yield, lifetime and durability.

BRIEF DESCRIPTION OF DRAWING

The features of the invention believed to be novel are set forth with particularity in the appended claims. The invention itself, however, may be best understood by reference to the following detailed description of the invention, which describes an exemplary embodiment of the invention, taken in conjunction with the accompanying drawings, in which:

DETAILED DESCRIPTION OF THE INVENTION

Figure 1A:
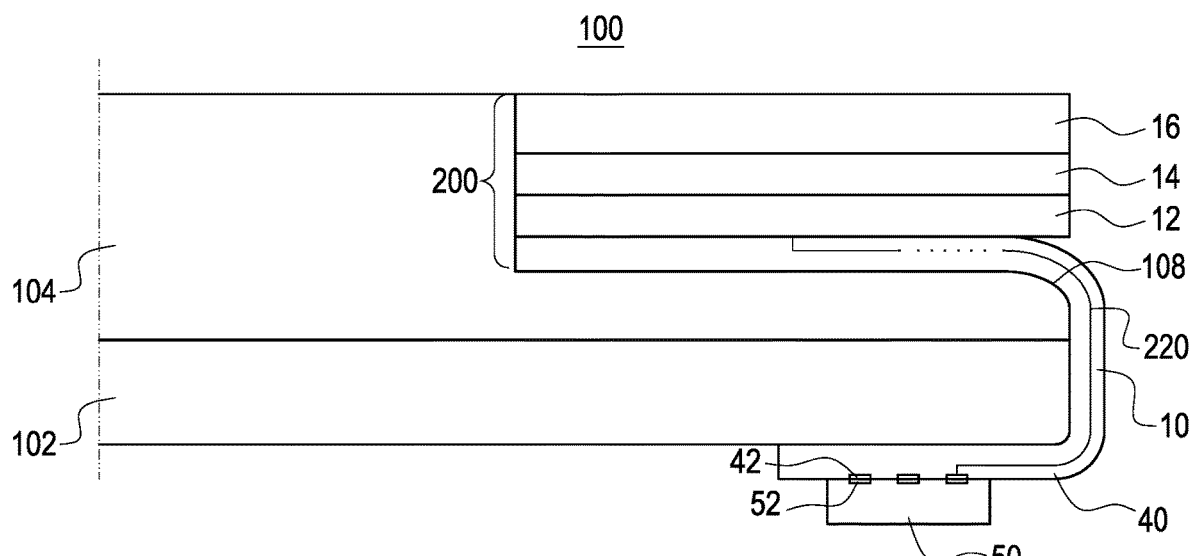
FIG. 1A is a schematic sectional view for the fingerprint sensing structure with small curvature radius according to an embodiment of the present invention.
Figure 1B:
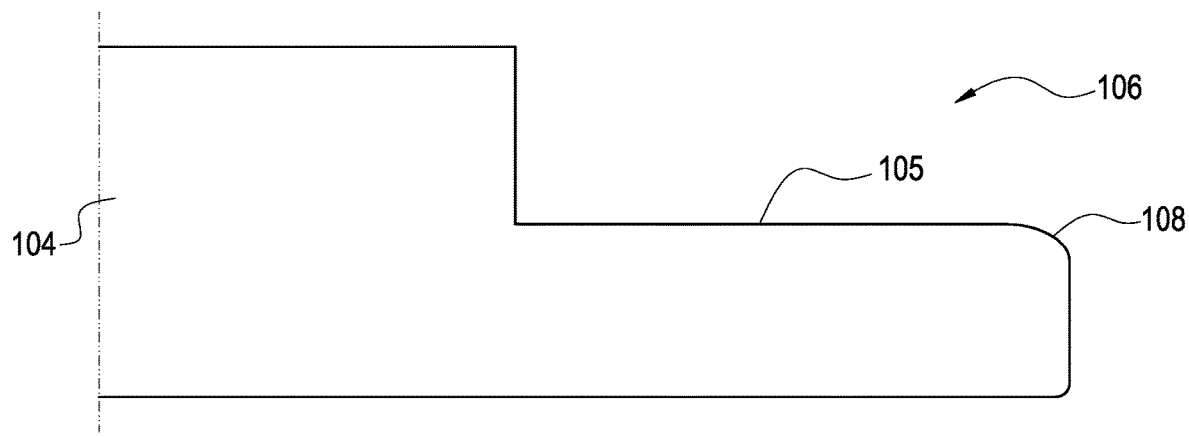
FIG. 1B is a schematic sectional view showing the protection glass in more detail.

FIG. 1A is a schematic sectional view for the fingerprint sensing structure 200 with small curvature radius according to an embodiment of the present invention. The fingerprint sensing structure 200 with small curvature radius (hereinafter, fingerprint sensing structure 200) can be used in an electronic apparatus 100 (such as a smart phone). The electronic apparatus 100 has a display 102 and a protection glass 104, which is arranged on the display 102 and adapted for the operation of user finger. FIG. 1B is a schematic sectional view showing the protection glass 104 in more detail. The protection glass 104 further comprises a recess 106 at a lateral edge thereof, and the protection glass 104 comprises a mounting face 105 corresponding to the recess 106, where the mounting face 105 has a chamfered structure 108 at a peripheral portion of the mounting face 105. As shown in FIG. 1A, the fingerprint sensing structure 200 comprises a fingerprint sensor 10, a gluing layer 12 and a decorative printing layer 14. According to one embodiment of the present invention, the fingerprint sensing structure 200 has an optional protection layer 16, which may be a cover layer or a cured coating layer. Besides, the fingerprint sensing structure 200 further comprises a plurality of conductive pads 42 on a non-fingerprint-sensing region (the portion not covered by the gluing layer 12 and the decorative printing layer 14). The conductive pads 42 are electrically connected to the conductive wires 220 in the fingerprint sensor 10. The fingerprint sensing structure 200 further comprises a fingerprint identification integrated circuit (IC) 50 on the non-fingerprint-sensing region of a flexible substrate, where the fingerprint identification IC 50 has a plurality of contacts 52 electrically connected to the conductive pads 42 arranged on a rear portion 40 of the flexible substrate. The fingerprint sensor 10 has a sensing electrode layer with a plurality of sensing electrodes, which will be described in more detail later. The fingerprint identification IC 50 sends capacitance excitation signals to the sensing electrodes (and receives the capacitance sensing signal from the conductive pads 42) through the contacts 52, the conductive pads 42 and the conductive wires 220, thus sense the user fingerprint information on the protection layer 16 or the decorative printing layer 14.

Figure 1C:
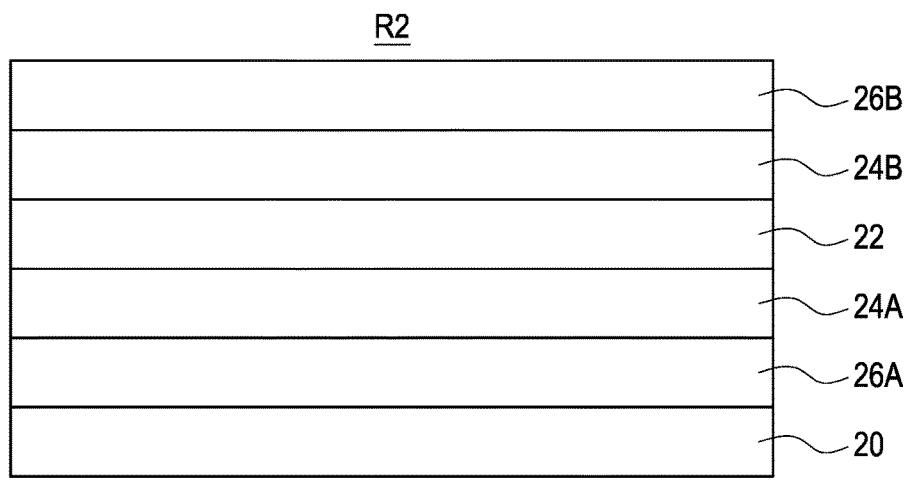
FIG. 1C shows a layered structure of the fingerprint sensing structure in the non-fingerprint-sensing region.

FIG. 1C shows a layered structure of the fingerprint sensing structure 200 in the non-fingerprint-sensing region R2. The fingerprint sensing structure 200 comprises, from top to bottom, a second inorganic insulating layer 26B, a second organic insulating layer 24B, a wiring layer 22, a first organic insulating layer 24A, a first inorganic insulating layer 26A, and a flexible substrate 20. The more detailed definition about the non-fingerprint-sensing region, the fingerprint-sensing region and material in each layer of the fingerprint sensing structure 200 will be made later with the attached drawings.

Figure 2:
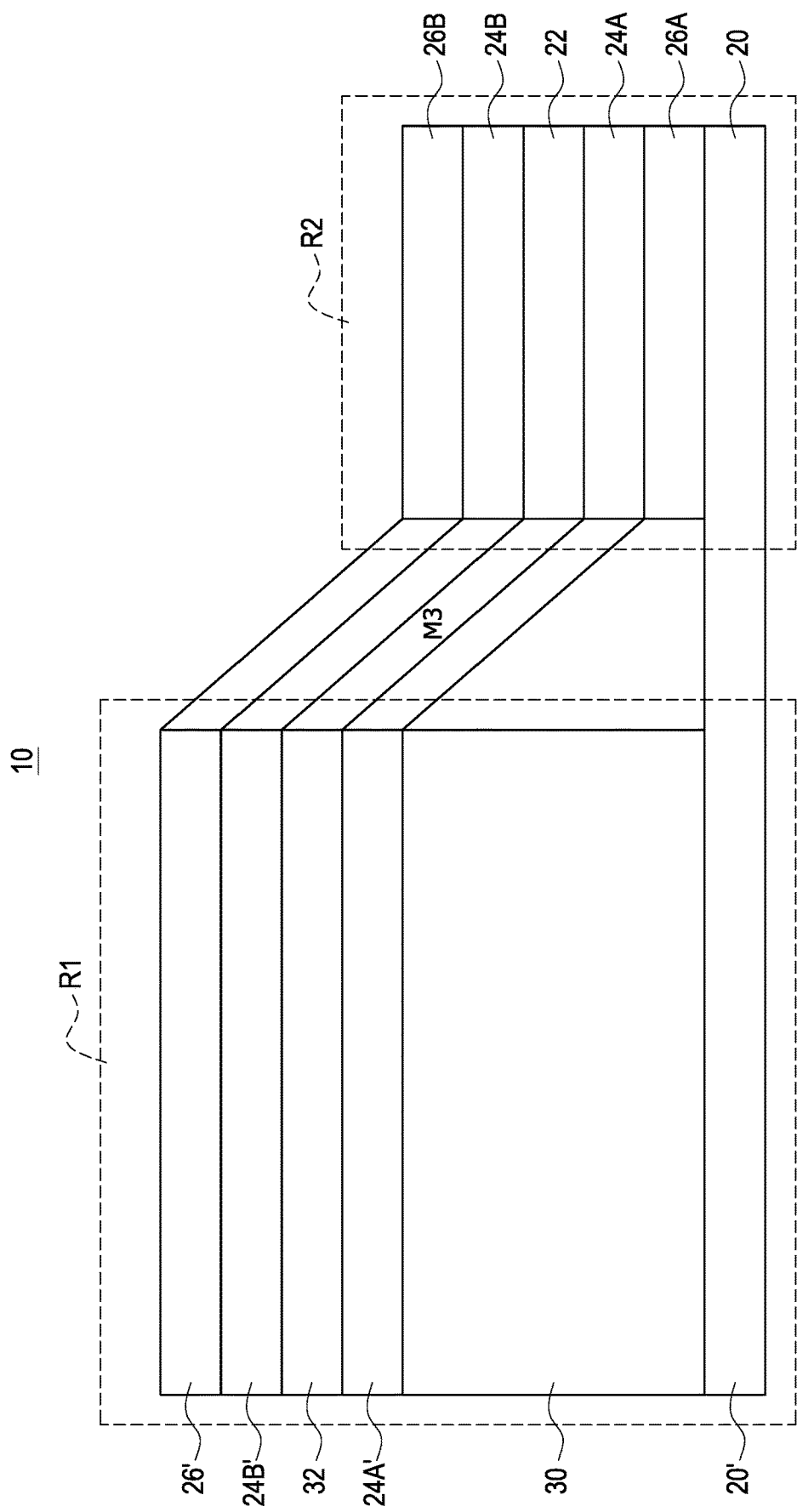
FIG. 2 shows a layered structure of the fingerprint sensor according to an embodiment of the present invention.

FIG. 2 shows a layered structure of the fingerprint sensor 10 according to an embodiment of the present invention. The fingerprint sensor 10 has a fingerprint-sensing region R1 and a non-fingerprint-sensing region R2. The fingerprint sensor 10 comprises, from top to bottom, an inorganic insulating layer 26', a second organic insulating layer 24B', a sensing electrode layer 32, first organic insulating layer 24A', a thin film transistor (TFT) layer 30 and a flexible substrate 20' in the fingerprint-sensing region R1. The fingerprint sensor 10 further comprises, from top to bottom, a second inorganic insulating layer 26B, a second organic insulating layer 24B, a wiring layer 22, a first organic insulating layer 24A, a first inorganic insulating layer 26A, and a flexible substrate 20 in the non-fingerprint-sensing region R2. In the embodiment shown in FIG. 2, the TFT layer 30 is electrically connected to the corresponding sensing electrodes in the sensing electrode layer 32 through via holes (not shown) in the first organic insulating layer 24A'. With reference also to FIG. 1A, the fingerprint identification IC 50 may electrically connect to the corresponding sensing electrodes in the sensing electrode layer 32 through the conductive wires 220 (corresponding to the wiring layer 22 in the non-fingerprint-sensing region R2) within the flexible substrate 20 of the fingerprint sensor 10, and then further electrically connect to the TFT layer 30 such that the fingerprint identification IC 50 can control the on/off switching of the TFTs in the TFT layer 30, which will be described in detail later. The portion of the fingerprint sensor 10 located in the non-fingerprint-sensing region R2 skirts around (runs around) the chamfered structure 108 with a bending having curvature radius not larger than 2 mm such that the fingerprint sensor 10 may bend to a lateral side of the protection glass 104 from the mounting face 105 of the protection glass 104, and then bend to the bottom face of the display 20. The conductive wires 220 in the wiring layer 22 are sandwiched between two organic insulating layers (namely, the first organic insulating layer 24A and the second organic insulating layer 24B). The organic insulating layers are flexible and deformable such that the conductive wires 220 in the wiring layer 22 are not broken or deformed after the conductive wires 220 are bent with curvature radius not larger than 2 mm.

Besides, in the structure shown in FIG. 2, the second inorganic insulating layer 26B in the non-fingerprint-sensing region R2 may be an integral extension of the inorganic insulating layer 26' in the fingerprint-sensing region R1 such that the second inorganic insulating layer 26B in the non-fingerprint-sensing region R2 and the inorganic insulating layer 26' in the fingerprint-sensing region R1 may be simultaneously formed in the same manufacturing process, thus saving manufacturing process and manufacturing cost. The second organic insulating layer 24B in the non-fingerprint-sensing region R2 may be an integral extension of the second organic insulating layer 24B' in the fingerprint-sensing region R1 such that the second organic insulating layer 24B in the non-fingerprint-sensing region R2 and the second organic insulating layer 24B' in the fingerprint-sensing region R1 may be simultaneously formed in the same manufacturing process, thus saving manufacturing process and manufacturing cost. The conductive wires of the wiring layer 22 in the non-fingerprint-sensing region R2 may electrically connect to the corresponding sensing electrodes of the sensing electrode layer 32 in the fingerprint-sensing region R1 through the conductive layer M3, where the conductive layer M3 may be made from metal or transparent conductive material (such as indium tin oxide, ITO). Besides, the wiring layer 22 in the non-fingerprint-sensing region R2 (and/or the conductive layer M3) and the sensing electrode layer 32 in the fingerprint-sensing region R1 may be simultaneously formed in the same manufacturing process, thus saving manufacturing process and manufacturing cost. The first inorganic insulating layer 26A in the non-fingerprint-sensing region R2 may be an integral extension of an inorganic material layer of the TFT layer 30 in the fingerprint-sensing region R1 such that the first inorganic insulating layer 26A in the non-fingerprint-sensing region R2 and the inorganic material layer of the TFT layer 30 in the fingerprint-sensing region R1 may be simultaneously formed in the same manufacturing process, thus saving manufacturing process and manufacturing cost.

Figure 3:
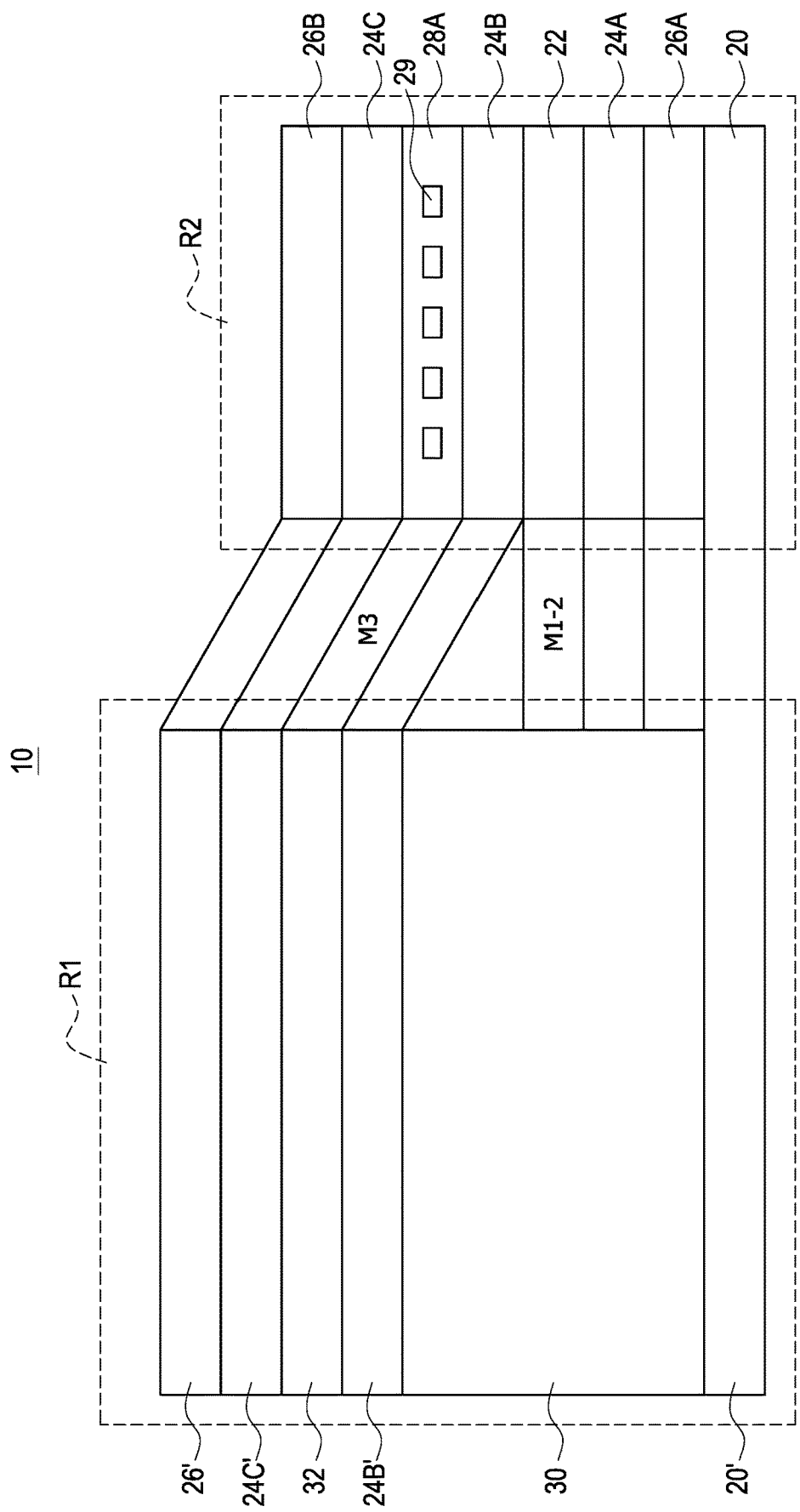
FIG. 3 shows a layered structure of the fingerprint sensor according to another embodiment of the present invention.

FIG. 3 shows a layered structure of the fingerprint sensor 10 according to another embodiment of the present invention. The fingerprint sensor 10 shown in FIG. 3 is similar to that shown in FIG. 2; however, the fingerprint sensor 10 shown in FIG. 3 further comprises a third organic insulating layer 24C and a first shielding layer 28A between the second inorganic insulating layer 26B and the second organic insulating layer 24B in the non-fingerprint-sensing region R2. Moreover, for the fingerprint sensor 10 shown in FIG. 3, the sensing electrode layer 32 is sandwiched between a third organic insulating layer 24C' and the second organic insulating layer 24B'. Similarly, in the fingerprint sensor 10 shown in FIG. 3, the second inorganic insulating layer 26B in the non-fingerprint-sensing region R2 may be an integral extension of the inorganic insulating layer 26' in the fingerprint-sensing region R1 such that the second inorganic insulating layer 26B in the non-fingerprint-sensing region R2 and the inorganic insulating layer 26' in the fingerprint-sensing region R1 may be simultaneously formed in the same manufacturing process, thus saving manufacturing process and manufacturing cost. Similarly, the third organic insulating layer 24C in the non-fingerprint-sensing region R2 may be an integral extension of the third organic insulating layer 24C' in the fingerprint-sensing region R1 such that the third organic insulating layer 24C in the non-fingerprint-sensing region R2 and the third organic insulating layer 24C' in the fingerprint-sensing region R1 may be simultaneously formed in the same manufacturing process, thus saving manufacturing process and manufacturing cost. The first shielding layer 28A and the sensing electrode layer 32 are, for example, arranged in the conductive layer M3. The first shielding layer 28A comprises at least one shielding electrode 29. The first shielding layer 28A in the non-fingerprint-sensing region R2 may be an integral extension of the sensing electrode layer 32 in the fingerprint-sensing region R1 such that the first shielding layer 28A in the non-fingerprint-sensing region R2 (and/or the conductive layer M3) and the sensing electrode layer 32 in the fingerprint-sensing region R1 may be simultaneously formed in the same manufacturing process, thus saving manufacturing process and manufacturing cost. The second organic insulating layer 24B in the non-fingerprint-sensing region R2 may be an integral extension of the second organic insulating layer 24B' in the fingerprint-sensing region R1 such that the second organic insulating layer 24B in the non-fingerprint-sensing region R2 and the second organic insulating layer 24B' in the fingerprint-sensing region R1 may be simultaneously formed in the same manufacturing process, thus saving manufacturing process and manufacturing cost. As shown in FIG. 3, the metal layer (such as gate line or data line) in the TFT layer 30 may electrically connect with the corresponding conductive wire of the wiring layer 22 in the non-fingerprint-sensing region R2 through the conductive layer M1-2. The wiring layer 22 in the non-fingerprint-sensing region R2 may be an integral extension of the metal layer (such as gate line or data line) of the TFT layer in the fingerprint-sensing region R1. Therefore, the wiring layer 22 in the non-fingerprint-sensing region R2 (and/or the conductive layer M1-2) and the metal layer of the TFT layer 30 in the fingerprint-sensing region R1 may be simultaneously formed in the same manufacturing process, thus saving manufacturing process and manufacturing cost. Besides, the first organic insulating layer 24A in the non-fingerprint-sensing region R2 may be an integral extension of the organic insulating material of the TFT layer 30 in the fingerprint-sensing region R1; the first inorganic insulating layer 26A in the non-fingerprint-sensing region R2 may be an integral extension of the inorganic insulating material of the TFT layer 30 in the fingerprint-sensing region R1, they may be simultaneously formed in the same manufacturing process respectively, thus saving manufacturing process and manufacturing cost. The material of the conductive layers M3, M1-2 may use metal or transparent conductive material (such as indium tin oxide, ITO). The first shielding layer 28A may provide good shielding effect for the wiring layer 22. Similarly, the portion of the fingerprint sensor 10 located in the non-fingerprint-sensing region R2 skirts around (runs around) the chamfered structure 108 with a bending having curvature radius not larger than 2 mm such that the fingerprint sensor 10 may bend to a lateral side of the protection glass 104 from the mounting face 105 of the protection glass 104, and then bend to the bottom face of the display 20. The conductive wires 220 in the wiring layer 22 are sandwiched between two organic insulating layers (namely, the first organic insulating layer 24A and the second organic insulating layer 24B). The organic insulating layers are flexible and deformable such that the conductive wires 220 in the wiring layer 22 are not broken or deformed after the conductive wires 220 are bent with curvature radius not larger than 2 mm.

Figure 4:
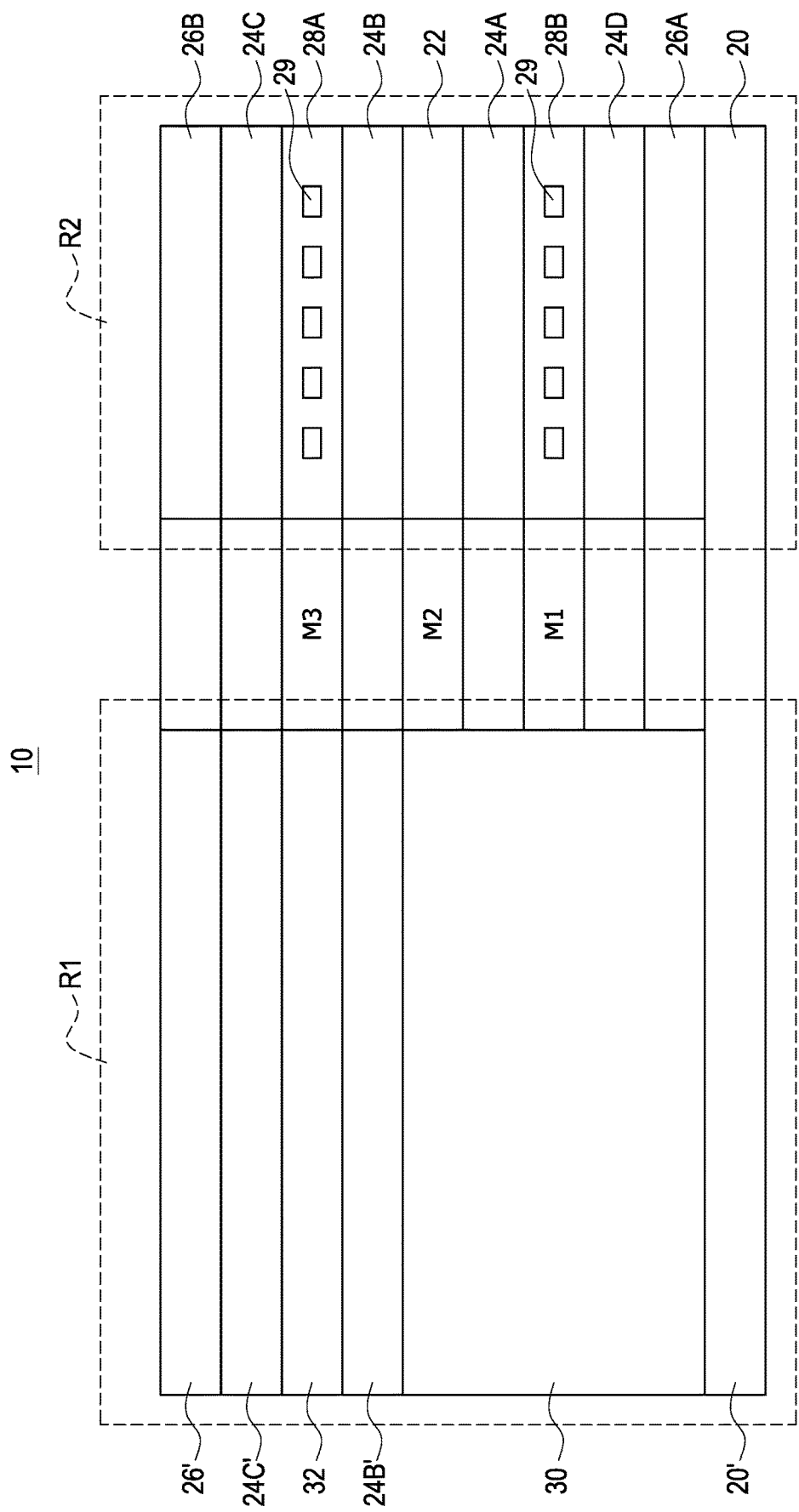
FIG. 4 shows a layered structure of the fingerprint sensor according to still another embodiment of the present invention.

FIG. 4 shows a layered structure of the fingerprint sensor 10 according to another embodiment of the present invention. The fingerprint sensor 10 shown in FIG. 4 is similar to that shown in FIG. 3; however, the fingerprint sensor 10 shown in FIG. 4 further comprises a second shielding layer 28B and a fourth organic insulating layer 24D between the first organic insulating layer 24A and the first inorganic insulating layer 26A in the non-fingerprint-sensing region R2. The second inorganic insulating layer 26B, the third organic insulating layer 24C, the first shielding layer 28A and the second organic insulating layer 24B in the non-fingerprint-sensing region R2 shown in FIG. 4 may also have similar manufacturing manner as those described with reference to embodiment of FIG. 3. Besides, the conductive wire of the wiring layer 22 in the non-fingerprint-sensing region R2 may electrically connect with the metal layer (such as one of gate line and data line) of the TFT layer 30 through a conductive layer M2. The wiring layer 22 in the non-fingerprint-sensing region R2 may be an integral extension of the metal layer (such as one of gate line and data line) of the TFT layer 30 in the fingerprint-sensing region R1. The second shielding layer 28B in the non-fingerprint-sensing region R2 comprises at least one shielding electrode 29 and may electrically connect with another metal layer (another one of gate line and data line) of the TFT layer 30 through a conductive layer M1. Similarly, the second shielding layer 28B in the non-fingerprint-sensing region R2 may be an integral extension of another metal layer (another one of gate line and data line) of the TFT layer 30 in the fingerprint-sensing region R1. The wiring layer 22 in the non-fingerprint-sensing region R2 (and/or the conductive layer M2) and the corresponding metal layer of the TFT layer 30 in the fingerprint-sensing region R1 may be simultaneously formed in the same manufacturing process; the second shielding layer 28B in the non-fingerprint-sensing region R2 (and/or the conductive layer M1) and the corresponding metal layer of the TFT layer 30 in the fingerprint-sensing region R1 may be simultaneously formed in the same manufacturing process, thus saving manufacturing process and manufacturing cost. The first organic insulating layer 24A and the fourth insulating layer 24D in the non-fingerprint-sensing region R2 may be integral extensions of corresponding organic insulating material of the TFT layer 30 in the fingerprint-sensing region R1, and they may be simultaneously formed in the same manufacturing process. The first inorganic insulating layer 26A in the non-fingerprint-sensing region R2 may be an integral extension of the inorganic insulating material of the TFT layer 30 in the fingerprint-sensing region R1, they may be simultaneously formed in the same manufacturing process, thus saving manufacturing process and manufacturing cost. In the embodiment shown in FIG. 4, the material of the conductive layers M1~M3 may use metal or transparent conductive material (such as indium tin oxide, ITO). The first shielding layer 28A and the second shielding layer 28B may provide good shielding effect for the wiring layer 22. Similarly, the portion of the fingerprint sensor 10 located in the non-fingerprint-sensing region R2 skirts (runs around) the chamfered structure 108 with a bending having curvature radius not larger than 2 mm such that the fingerprint sensor 10 may bend to a lateral side of the protection glass 104 from the mounting face 105 of the protection glass 104, and then bend to the bottom face of the display 20. The conductive wires 220 in the wiring layer 22 are sandwiched between two organic insulating layers (namely, the first organic insulating layer 24A and the second organic insulating layer 24B). The organic insulating layers are flexible and deformable such that the conductive wires 220 in the wiring layer 22 are not broken or deformed after the bending with curvature radius not larger than 2 mm.

Figure 5:
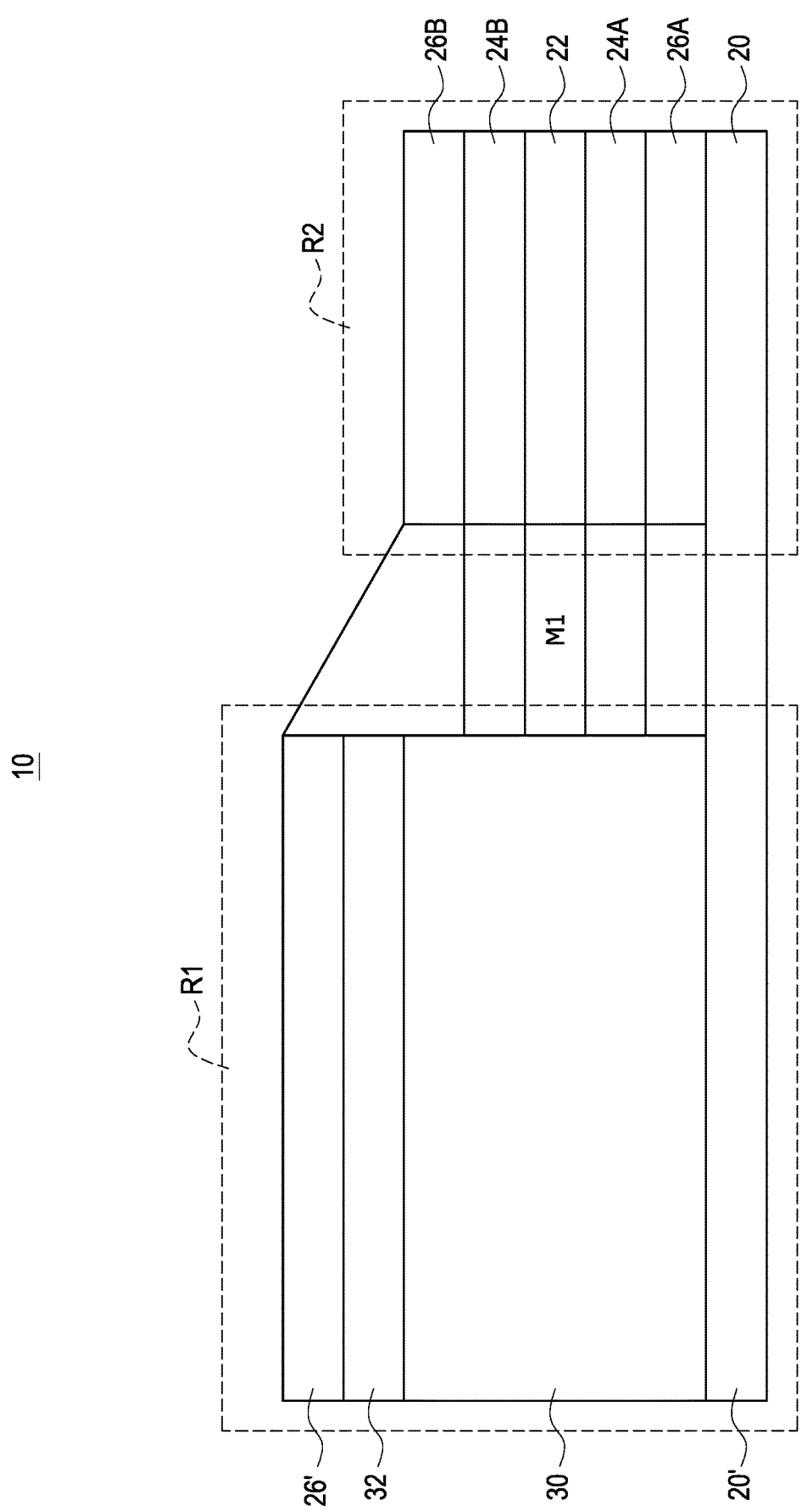
FIG. 5 shows a layered structure of the fingerprint sensor according to still another embodiment of the present invention.

FIG. 5 shows a layered structure of the fingerprint sensor 10 according to another embodiment of the present invention. The fingerprint sensor 10 shown in FIG. 5 is similar to that shown in FIG. 2; however, the fingerprint sensor 10 shown in FIG. 5 does not have the first organic insulating layer 24A' and the second organic insulating layer 243 in the fingerprint-sensing region R1 shown in FIG. 2. As shown in FIG. 5, the first organic insulating layer 24A' and the second organic insulating layer 24B' may be integral extensions of corresponding organic insulating material of the TFT layer 30 in the fingerprint-sensing region R1, and they may be simultaneously formed in the same manufacturing process to save manufacturing process and manufacturing cost. The wiring layer 22 in the non-fingerprint-sensing region R2 may electrically connect with a metal layer (such as one of gate line and data line) of the TFT layer 30 in the fingerprint-sensing region R1 through a conductive layer M1. Therefore, the wiring layer 22 in the non-fingerprint-sensing region R2 may be an integral extension of the metal layer (such as one of gate line and data line) of the TFT layer 30 in the fingerprint-sensing region R1, and they may be simultaneously formed in the same manufacturing process to save manufacturing process and manufacturing cost. The first inorganic insulating layer 26A in the non-fingerprint-sensing region R2 may be an integral extension of the inorganic insulating material of the TFT layer 30 in the fingerprint-sensing region R1, they may be simultaneously formed in the same manufacturing process, thus saving manufacturing process and manufacturing cost. In the embodiment shown in FIG. 5, the material of the conductive layer M1 may use metal or transparent conductive material (such as indium tin oxide, ITO). Similarly, the portion of the fingerprint sensor 10 located in the non-fingerprint-sensing region R2 skirts around (runs around) the chamfered structure 108 with a bending having curvature radius not larger than 2 mm such that the fingerprint sensor 10 may bend to a lateral side of the protection glass 104 from the mounting face 105 of the protection glass 104, and then bend to the bottom face of the display 20. The conductive wires 220 in the wiring layer 22 are sandwiched between two organic insulating layers (namely, the first organic insulating layer 24A and the second organic insulating layer 24B). The organic insulating layers are flexible and deformable such that the conductive wires 220 in the wiring layer 22 are not broken or deformed after the conductive wires 220 are bent with curvature radius not larger than 2 mm.

Figure 6:
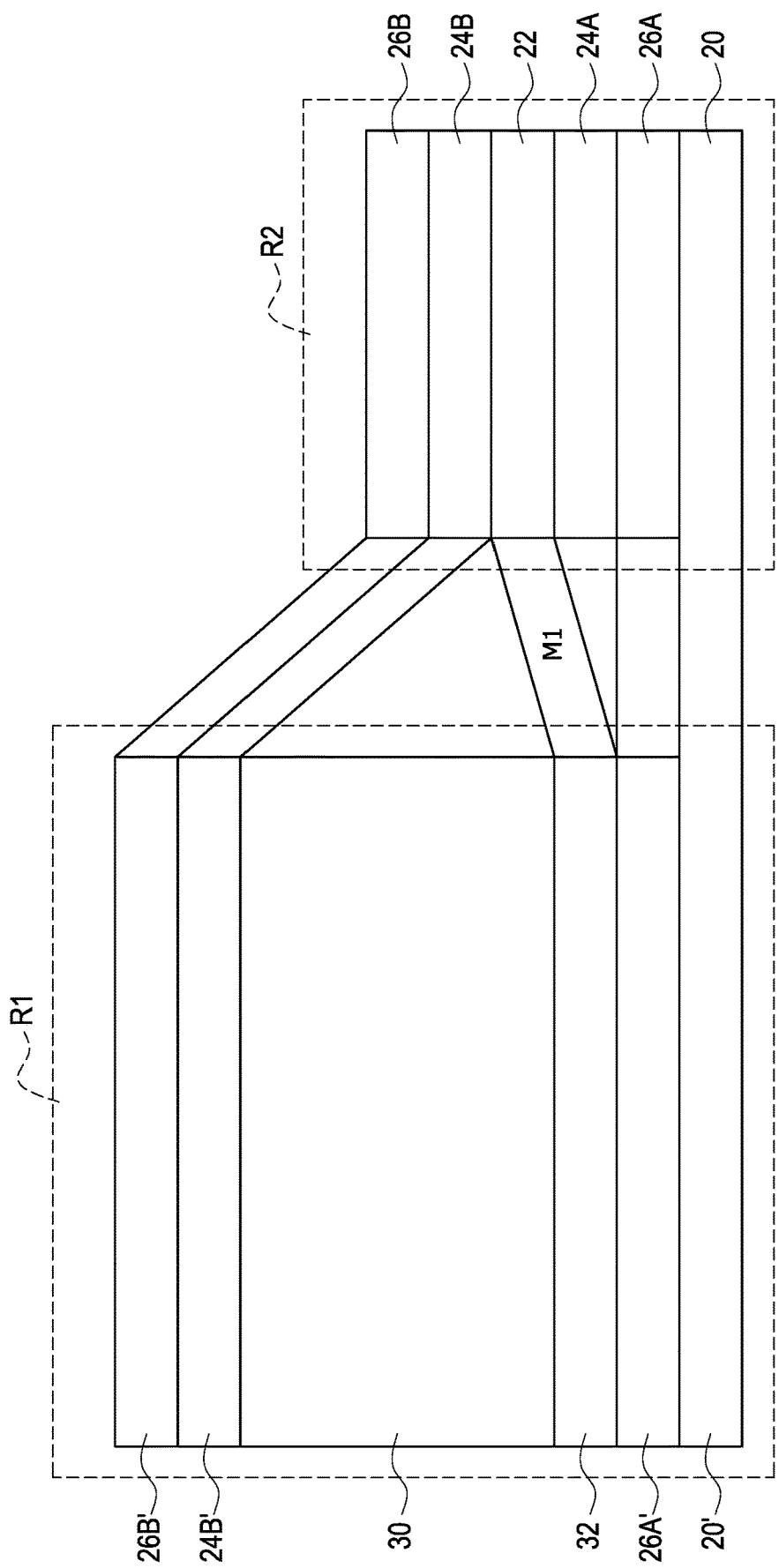
FIG. 6 shows a layered structure of the fingerprint sensor according to still another embodiment of the present invention.

FIG. 6 shows a layered structure of the fingerprint sensor 10 according to another embodiment of the present invention. The fingerprint sensor 10 shown in FIG. 6 is similar to that shown in FIG. 2; however, the positions of the TFT layer 30 and the sensing electrode layer 32 in the fingerprint-sensing region R1 are switched. Besides, the fingerprint sensor 10 shown in FIG. 6 further has a first inorganic insulating layer 26A' and does not have the first organic insulating layer 24A' shown in FIG. 2. As shown in FIG. 6, the second inorganic insulating layer 26B in the non-fingerprint-sensing region R2 may be an integral extension of the second inorganic insulating layer 26B' in the fingerprint-sensing region R1, the second organic insulating layer 24B in the non-fingerprint-sensing region R2 may be an integral extension of the second organic insulating layer 24B' in the fingerprint-sensing region R1; they may be simultaneously formed in the same manufacturing process to save manufacturing process and manufacturing cost. The conductive wires of the wiring layer 22 in the non-fingerprint-sensing region R2 may electrically connected to the corresponding sensing electrodes of the sensing electrode layer 32 in the fingerprint-sensing region R1 through the conductive layer M1, where the conductive layer M1 may be made from metal or transparent conductive material (such as indium tin oxide, ITO). Besides, the wiring layer 22 in the non-fingerprint-sensing region R2 (and/or the conductive layer M1) and the sensing electrode layer 32 in the fingerprint-sensing region R1 may be simultaneously formed in the same manufacturing process, thus saving manufacturing process and manufacturing cost. The first inorganic insulating layer 26A in the non-fingerprint-sensing region R2 may be an integral extension of the first inorganic insulating layer 26A' in the fingerprint-sensing region R1; they may be simultaneously formed in the same manufacturing process to save manufacturing process and manufacturing cost.

In the embodiments shown in FIGS. 2~6, the organic material for the inorganic insulating layer is, for example, SiNx such as $Si_3N_4$, silicon oxide such as $SiO_2$, alumina, barium titanate, cerium zirconate titanate, $Al_2O_3$ or $TiO_2$. The inorganic material for the organic insulating layer is, for example, polyester, polycarbonate (PC), poly(vinylphenol), polyimide, poly (vinyl alcohol), polystyrene, polyacrylate, polyacrylonitrile, photosensitive polypropylene or epoxy and so on.

Figure 7:
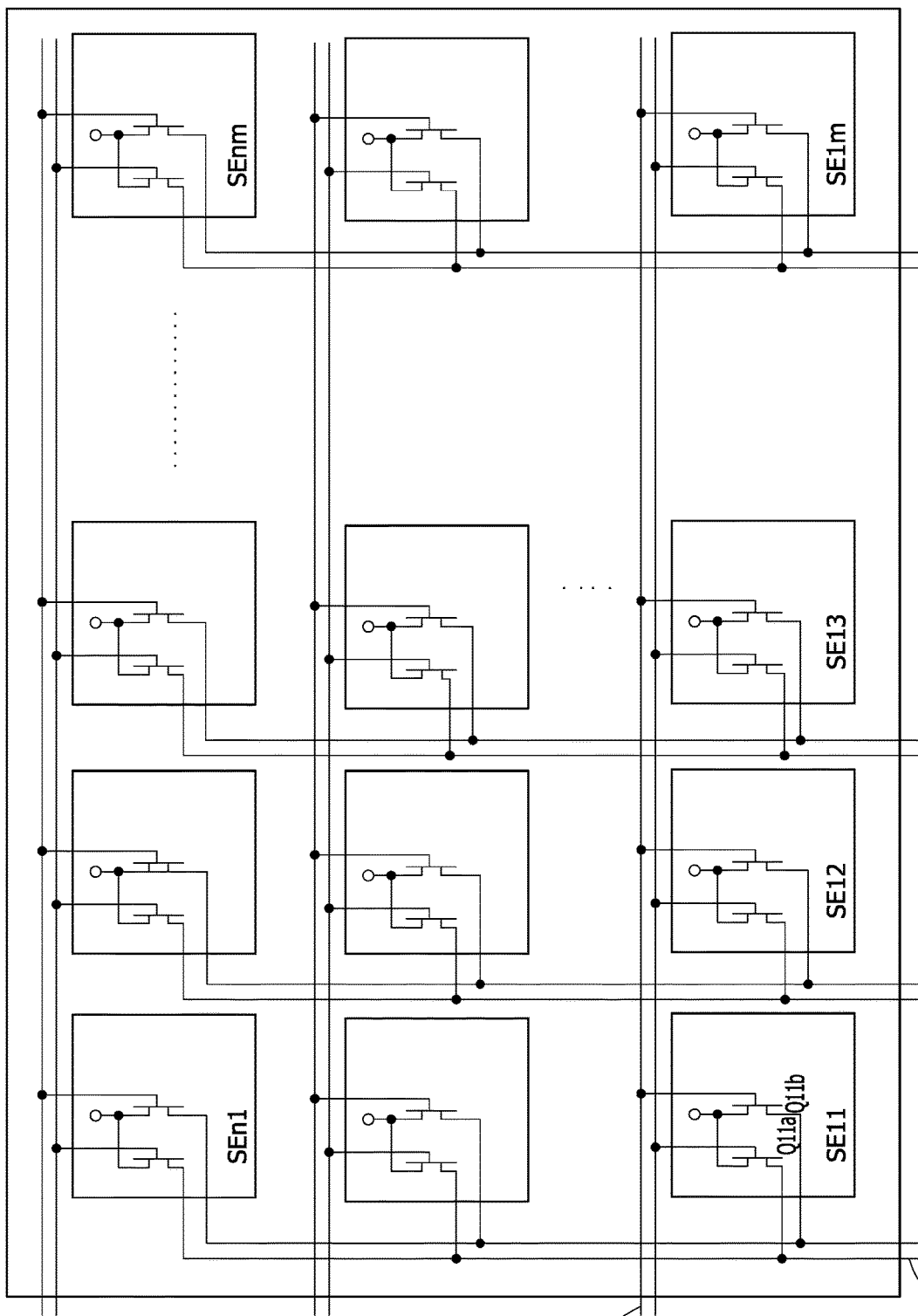
FIG. 7 is a schematic view showing the arrangement of the sensing electrodes in the sensing electrode layer and the thin film transistors in the TFT layer for the fingerprint sensor according to the present invention.

FIG. 7 is a schematic view showing the arrangement of the sensing electrodes in the sensing electrode layer 32 and the thin film transistors in the TFT layer 30 for the fingerprint sensor 10 according to the present invention. As shown in this figure, the sensing electrode layer 32 comprises a plurality of sensing electrodes SE11~SEnm. Each of the sensing electrodes SE11~SEnm is corresponding to a plurality of thin film transistors. For example, the sensing electrodes SE11 is corresponding to two thin film transistors Q11a and Q11b in the TFT layer 30. The fingerprint identification IC 50 may send control signals to the gates of the thin film transistors in the TFT layer 30 through conductive wires 220 to selectively turn on the thin film transistors. Moreover, the fingerprint identification IC 50 may send capacitance excitation signal to the sources (or drains) of the thin film transistors in the TFT layer 30 through conductive wires 220 to further send the capacitance excitation signal to the sensing electrode electrically connected to the sources (or drains) of the thin film transistors. By this way, the fingerprint identification IC 50 may sense the capacitance change of corresponding sensing electrode. In above embodiment, the conductive wires in the non-fingerprint-sensing region R2 may be made from metallic material, the conductive wires along the first direction and the second direction in the fingerprint-sensing region R1 may be made from transparent conductive material or metallic material. Beside, with reference back FIG. 1A, the thickness of the fingerprint sensing structure 200 in the fingerprint-sensing region R1 and not including the protection layer 16 is smaller than 300 um, and more particularly, is smaller than 250 um.

To sum up, the wiring layer of the present invention is protected and part of the fingerprint-sensing region can be bent with smaller curvature radius to prevent the breakage of the conductive wires in the wiring layer and to enhance the yield, lifetime and durability of the fingerprint sensing structure. At least part of the material layer in the fingerprint-sensing region are extended from corresponding material layer in the non-fingerprint-sensing region, and they may be simultaneously formed in the same manufacturing process to save manufacturing process and manufacturing cost.

Although the present invention has been described with reference to the foregoing preferred embodiment, it will be understood that the invention is not limited to the details thereof. Various equivalent variations and modifications can still occur to those skilled in this art in view of the teachings of the present invention. Thus, all such variations and equivalent modifications are also embraced within the scope of the invention as defined in the appended claims.

What is claimed is:

1. A fingerprint sensing structure with small curvature radius, comprising:
    a flexible substrate divided into a fingerprint-sensing region and a non-fingerprint-sensing region;
    in the non-fingerprint-sensing region, the fingerprint sensing structure comprising:
    a plurality of organic insulating layers,
    a wiring layer having a plurality of conductive wires, where the wiring layer is sandwiched between two organic insulating layers to render a portion of the fingerprint sensing structure corresponding to the non-fingerprint-sensing region to have bending with curvature radius not larger than 2 mm;
    at least one inorganic insulating layer, wherein the wiring layer is arranged between one of the organic insulating layers and the at least one inorganic insulating layer;
    in the finger-sensing region, the fingerprint sensing structure comprising:
    a thin film transistor layer comprising:
    a plurality of thin film transistors,
    a plurality of conductive wires along a first direction,
    a plurality of conductive wires along a second direction,
    a sensing electrode layer having a plurality of sensing electrodes to sense surface features of living organism.

2. The fingerprint sensing structure in claim 1, further comprising a first shielding layer arranged in the non-fingerprint-sensing region of the fingerprint sensing structure and having at least one shielding electrode.

3. The fingerprint sensing structure in claim 2, wherein the first shielding layer is sandwiched between two organic insulating layers.

4. The fingerprint sensing structure in claim 2, further comprising a second shielding layer arranged in the non-fingerprint-sensing region of the fingerprint sensing structure and having at least one shielding electrode.

5. The fingerprint sensing structure in claim 4, wherein the second shielding layer is sandwiched between two organic insulating layers.

6. The fingerprint sensing structure in claim 1, further comprising: a plurality of conductive pads arranged in the non-fingerprint-sensing region of the fingerprint sensing structure, the plurality of conductive pads electrically connecting with the conductive wires respectively.

7. The fingerprint sensing structure in claim 6, further comprising a fingerprint identification integrated circuit (IC) in the non-fingerprint-sensing region of the fingerprint sensing structure, the fingerprint identification IC having a plurality of contacts electrically connecting with the conductive pads respectively.

8. The fingerprint sensing structure in claim 1, wherein the conductive wires in the non-fingerprint-sensing region are made from transparent conductive material or metallic material.

9. The fingerprint sensing structure in claim 1, wherein the conductive wires along the first direction in the fingerprint-sensing region and the conductive wires along the second direction in the fingerprint-sensing region are made from transparent conductive material or metallic material.

10. The fingerprint sensing structure in claim 1, further comprising a protection layer in the fingerprint-sensing region to prevent damage caused by finger scratch or pressing.

11. The fingerprint sensing structure in claim 1, further comprising a printing decorative layer in the fingerprint-sensing region.

12. The fingerprint sensing structure in claim 10, wherein a thickness of the fingerprint sensing structure in the fingerprint-sensing region and not including the protection layer is smaller than 300 um.

13. The fingerprint sensing structure in claim 12, wherein the thickness of the fingerprint sensing structure in the fingerprint-sensing region and not including the protection layer is smaller than 250 um.

\* \* \* \* \*